US012589942B2

(12) United States Patent
Oh et al.

(10) Patent No.: US 12,589,942 B2
(45) Date of Patent: Mar. 31, 2026

(54) STORAGE APPARATUS, A TRANSFER SYSTEM INCLUDING THE SAME, AND A TRANSFERRING METHOD USING THE TRANSFER SYSTEM

(71) Applicant: Samsung Electronics Co., Ltd., Suwon-si (KR)

(72) Inventors: Youngon Oh, Suwon-si (KR); Chunghyuk You, Suwon-si (KR); Jihun Kim, Suwon-si (KR); Sanghyuk Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 345 days.

(21) Appl. No.: 18/227,111

(22) Filed: Jul. 27, 2023

(65) Prior Publication Data

US 2024/0228166 A1     Jul. 11, 2024

(30) Foreign Application Priority Data

Jan. 11, 2023   (KR) ........................ 10-2023-0004250
Mar. 7, 2023   (KR) ........................ 10-2023-0030176

(51) Int. Cl.
*B65G 1/127*       (2006.01)
*B65G 1/02*        (2006.01)
*B65G 69/26*       (2006.01)
*H01L 21/677*      (2006.01)

(52) U.S. Cl.
CPC .............. *B65G 1/127* (2013.01); *B65G 1/026* (2013.01); *B65G 69/26* (2013.01); *B65G*
*2203/046* (2013.01); *H01L 21/67724* (2013.01); *H01L 21/67733* (2013.01); *H01L 21/6779* (2013.01)

(58) Field of Classification Search
CPC ........ B65G 1/127; B65G 1/026; B65G 69/26; B65G 2203/046; H01L 21/67724; H01L 21/67733; H01L 21/6779; H01L 21/67769
See application file for complete search history.

(56) References Cited

U.S. PATENT DOCUMENTS

| | | | |
|---|---|---|---|
| 6,746,197 | B2 | 6/2004 | Kimura et al. |
| 8,277,161 | B2 | 10/2012 | Aburatani et al. |
| 9,139,380 | B2 * | 9/2015 | Inui ................... H01L 21/67733 |
| 9,520,313 | B2 | 12/2016 | Ota |

FOREIGN PATENT DOCUMENTS

| | | | | |
|---|---|---|---|---|
| ES | 2528100 | T3 * | 2/2015 | ............. B65G 1/127 |
| JP | 2004059223 | A * | 2/2004 | |
| JP | 2019004089 | A | 1/2019 | |
| KR | 101799217 | B1 * | 11/2017 | ....... H01L 21/67769 |
| KR | 1020210138354 | A | 11/2021 | |

* cited by examiner

*Primary Examiner* — Justin Holmes
(74) *Attorney, Agent, or Firm* — Muir Patent Law, PLLC

(57)     ABSTRACT

A storage apparatus includes a support part fixedly coupled to a ceiling surface, a rotating plate under the support part, a driving unit connecting the support part and the rotating plate, and a plurality of tables spaced apart from each other. The plurality of tables has an axis. The plurality of tables is connected to the rotating plate. The rotating plate is rotatable about a rotation axis parallel to the axis.

20 Claims, 15 Drawing Sheets

STORAGE APPARATUS, A TRANSFER SYSTEM INCLUDING THE SAME, AND A TRANSFERRING METHOD USING THE TRANSFER SYSTEM

CROSS-REFERENCE TO RELATED APPLICATIONS

This U.S. non-provisional patent application claims priority under 35 U.S.C. § 119 to Korean Patent Application No. 10-2023-0004250, filed on Jan. 11, 2023, and to Korean Patent Application No. 10-2023-0030176, filed on Mar. 7, 2023, in the Korean Intellectual Property Office, the entire contents of both being hereby incorporated by reference.

BACKGROUND OF THE INVENTION

The present disclosure relates to a storage apparatus, a transfer system including the same, and a transferring method using the transfer system. More particularly, the present disclosure relates to a storage apparatus including a plurality of tables, a transfer system including the same, and a transferring method using the transfer system.

Generally, a substrate (for example a semiconductor substrate) may be provided into process equipment for performing a process by using a carrier (e.g., a front opening unified pod (FOUP) or a front opening shipping box (FOSB)) receiving a plurality of substrates or may be unloaded from the process equipment by using the carrier. In general, the carrier may be transferred by an overhead hoist transport (OHT). The overhead hoist transport may transfer and load a carrier, in which substrates to be processed are received into an empty storage structure and may pick up and transfer a carrier, in which processed substrates are received from the storage structure to the outside.

SUMMARY

Embodiments of the inventive concepts may provide a storage apparatus including a plurality of tables, a transfer system including the same, and a transferring method using the transfer system.

In an aspect, a storage apparatus may include a support part fixedly coupled to a ceiling surface, a rotating plate under the support part, a driving unit connecting the support part and the rotating plate, and a plurality of tables spaced apart from each other. Each of the plurality of tables may have an axis. Each of the plurality of tables may be connected to the rotating plate. The rotating plate may be rotatable about a rotation axis parallel to the axis.

In an aspect, a transfer system may include a transfer rail fixedly coupled to a ceiling surface, a transfer apparatus which is movable along the transfer rail and comprises a tag sensor, and a storage apparatus spaced apart from the transfer rail in a horizontal direction. The storage apparatus may include a support part comprising a tag, a driving unit connected to the support part, a rotating plate connected to the driving unit, and a plurality of tables coupled to the rotating plate. Each of the plurality of tables may be parallel to the horizontal direction. In an aspect, a transferring method may include moving a transfer apparatus to a storage apparatus including a plurality of tables, loading a carrier by the transfer apparatus, storing the carrier in the storage apparatus, and unloading the carrier by the transfer apparatus. Each of the loading and unloading of the carrier may include rotating a rotating plate coupled to the plurality of tables, maintaining the plurality of tables in parallel to a horizontal direction, and locating one of the plurality of tables in a pick-up space.

BRIEF DESCRIPTION OF THE DRAWINGS

Figure 16:
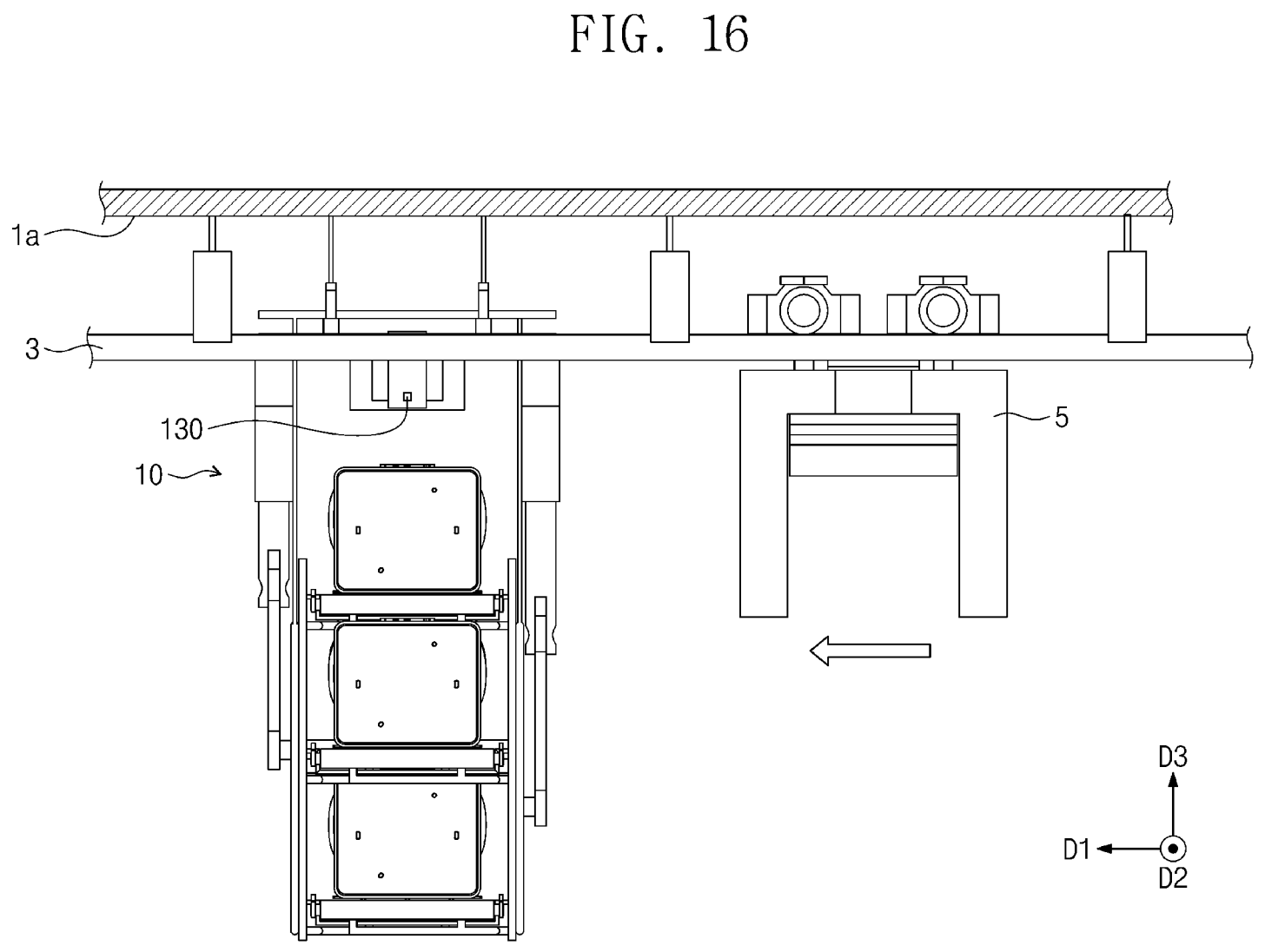

FIGS. 12 to 16 are views illustrating a transferring method according to some embodiments of the inventive concepts.

DETAILED DESCRIPTION

Figure 1:
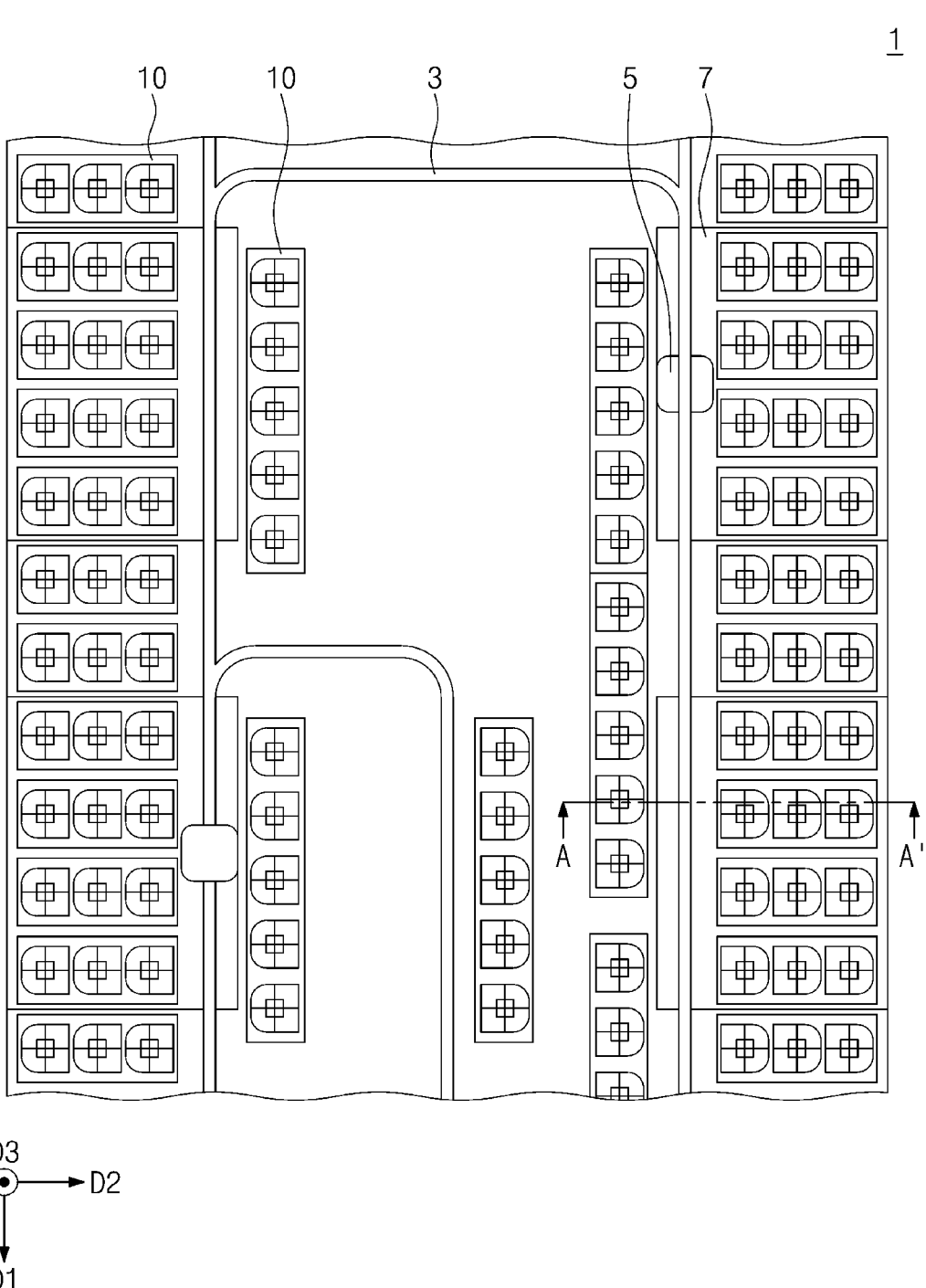
FIGS. 1 and 2 are plan views illustrating a transfer system according to some embodiments of the inventive concepts.

Hereinafter, embodiments of the inventive concepts will be described in detail with reference to the accompanying drawings. The same reference numerals or the same reference designators may denote the same components or elements throughout the specification.

Figure 2:
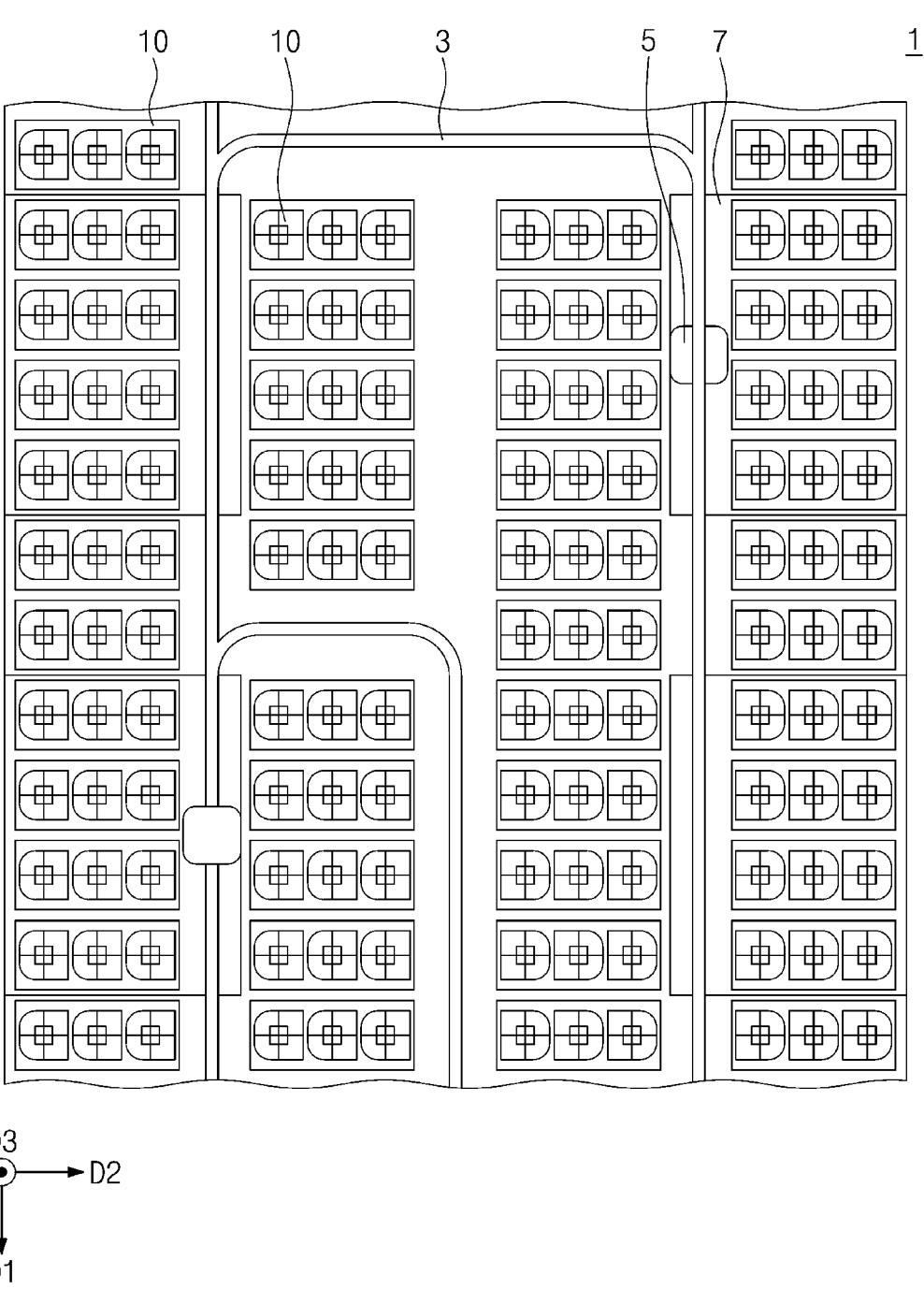

FIGS. 1 and 2 are plan views illustrating a transfer system according to some embodiments of the inventive concepts.

Referring to FIGS. 1 and 2, a semiconductor production line 1 may be provided. The semiconductor production line 1 may include a transfer system and a substrate processing apparatus 7. The transfer system may transfer/unload a carrier C (FIG. 3), in which a plurality of substrates is received, to/from the substrate processing apparatus 7 and may store the carrier C. For example, the substrate may be a semiconductor wafer and/or a semiconductor package, and the carrier C may be a front opening unified pod (FOUP) and/or a front opening shipping box (FOSB).

The transfer system may include a transfer rail 3, a transfer apparatus 5, and a storage apparatus 10. The transfer rail 3 may have a shape extending in a first direction D1 or a second direction D2. A plurality of transfer rails 3 may be provided. For example, one transfer rail 3 may divide into two transfer rails 3, and/or two transfer rails 3 may merge into one transfer rail 3. The transfer apparatus 5 may be moved along the transfer rail 3, and thus adjacent transfer rails 3 may be spaced apart from each other by a certain distance.

The transfer apparatus 5 may be movable along the transfer rail 3. The transfer apparatus 5 may be movable in the first direction D1 or the second direction D2, or in another direction such as for example a direction at an angle to D1 and D2, and e.g., in the same plane as D1 and D2. The transfer apparatus 5 may transfer the carrier C in which the substrates are received. The carrier C may be transferred to or from the substrate processing apparatus 7 by the transfer rail 3 and the transfer apparatus 5. For example, the transfer apparatus 5 may include an overhead hoist transport (OHT).

The storage apparatus 10 may be disposed adjacent to the transfer rail 3. The storage apparatus 10 may provide a certain space in which the carrier C may be located, and the carrier C may be located in the space for a certain time. The storage apparatus 10 may store the carrier C. For example, the carrier C may be temporarily stored in the storage apparatus 10 before or after being loaded into the substrate processing apparatus 7. The storage apparatus 10 may include a non-motorized storage apparatus and a motorized storage apparatus. For example, the non-motorized storage apparatus may be a typical storage apparatus, and the motorized storage apparatus may be the storage apparatus according to some embodiments of the inventive concepts.

According to the embodiments of FIG. 1, the non-motorized storage apparatus and the motorized storage apparatus may be located at both sides of the transfer rail 3. The non-motorized storage apparatus and the motorized storage apparatus may be opposite to each other, and the transfer rail 3 may be located between the non-motorized storage apparatus and the motorized storage apparatus. For example, the motorized storage apparatus may be located on the substrate processing apparatus 7, but embodiments of the inventive concepts are not limited thereto. In certain embodiments, the non-motorized storage apparatus may be located on the substrate processing apparatus 7. According to the embodiments of FIG. 2, the storage apparatus 10 may not include the non-motorized storage apparatus but may include only the motorized storage apparatuses. The motorized storage apparatuses may be disposed at both sides of the transfer rail 3.

The substrate processing apparatus 7 may be provided in the semiconductor production line 1 and may be spaced apart from another substrate processing apparatus 7 in a horizontal direction. The substrate processing apparatus 7 may overlap with the transfer system when viewed in a plan view. The substrate processing apparatus 7 may be located under the transfer system. The substrate processing apparatus 7 may be an apparatus for manufacturing a semiconductor device. The substrate processing apparatus 7 may perform a semiconductor process. For example, the semiconductor process may include an exposure process, an etching process, a deposition process, a cleaning process, and/or an ion implantation process.

Figure 3:
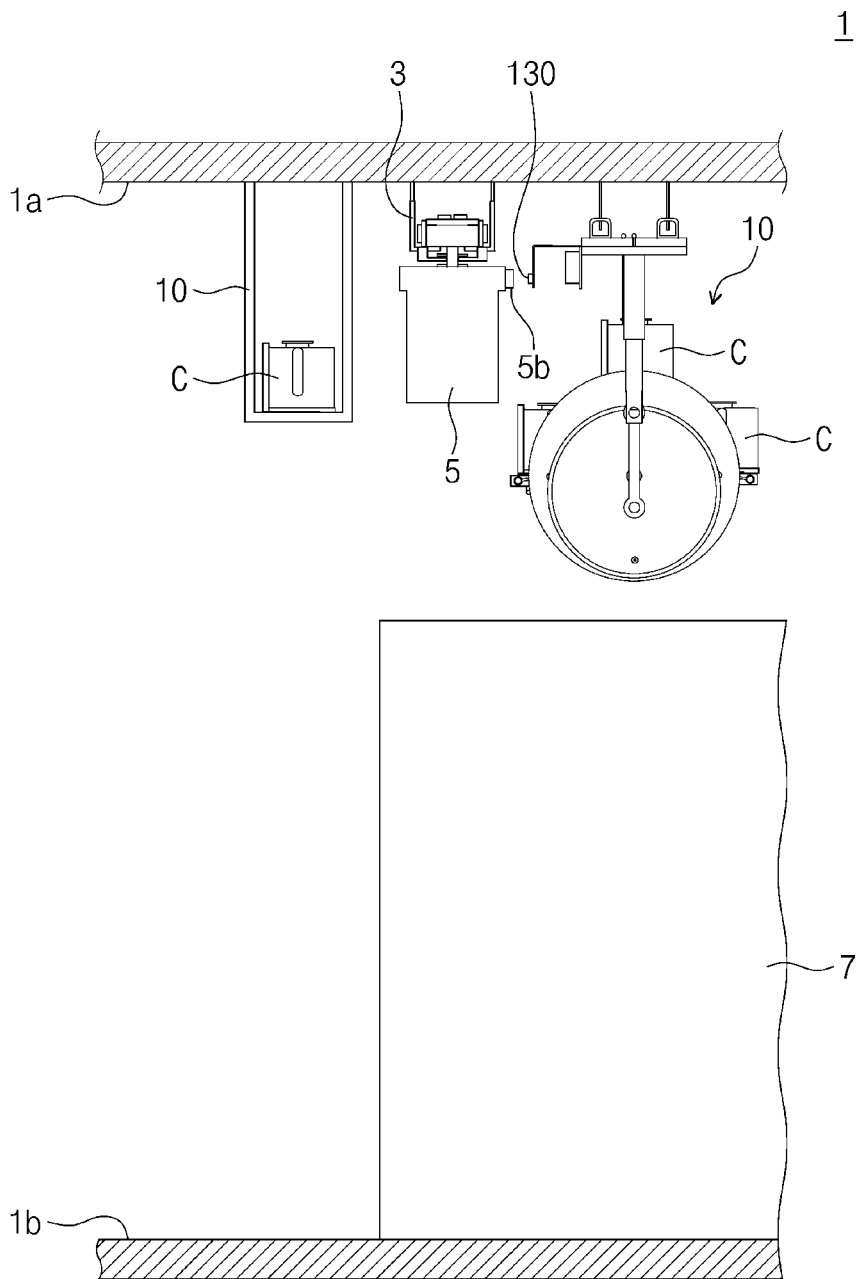
FIG. 3 is a cross-sectional view taken along a line A-A' of FIG. 1 to illustrate a transfer system according to some embodiments of the inventive concepts.
Figure 3:
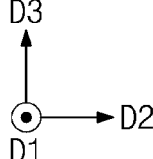

FIG. 3 is a cross-sectional view taken along a line A-A' of FIG. 1 to illustrate a transfer system according to some embodiments of the inventive concepts.

Referring to FIG. 3, the semiconductor production line 1 may have a ceiling surface 1a and a bottom surface 1b. The ceiling surface 1a and the bottom surface 1b may be opposite to each other. A space may be provided between the ceiling surface 1a and the bottom surface 1b of the semiconductor production line 1, and the transfer rail 3, the transfer apparatus 5, the storage apparatus 10 and the substrate processing apparatus 7 may be located in the space.

More particularly, the substrate processing apparatus 7 may be located on the bottom surface 1b and may be in contact with the bottom surface 1b. The substrate processing apparatus 7 may be spaced apart from the ceiling surface 1a in a third direction D3. The substrate processing apparatus 7 may be spaced apart from the transfer rail 3 and the storage apparatuses 10 in the third direction D3.

The transfer rail 3 and the storage apparatuses 10 may be located on the ceiling surface 1a and may be fixedly coupled to the ceiling surface 1a not to move. Alternatively, the transfer rail 3 can be fixedly coupled to floor posts, wall connectors, or supports other than the ceiling surface. The transfer rail 3 and the storage apparatuses 10 may be spaced apart from the bottom surface 1b in the third direction D3. The transfer apparatus 5 may be located at the transfer rail 3. The storage apparatuses 10 may be located at both sides of the transfer rail 3. For example, the non-motorized storage apparatus may be located at a side of the transfer rail 3, and the motorized storage apparatus may be located at an opposite side of the transfer rail 3. Alternatively, the motorized storage apparatuses may be located at both sides of the transfer rail 3.

The transfer rail 3 and the storage apparatuses 10 may be located to be closer to the ceiling surface 1a than to the bottom surface 1b. Since the transfer rail 3 and the storage apparatuses 10 are fixedly coupled to the ceiling surface 1a and are spaced apart from the bottom surface 1b in the third direction D3, the substrate processing apparatus 7 may be located under the transfer rail 3 and the storage apparatuses 10. In addition, an operator may be freely movable under the transfer rail 3 and the storage apparatuses 10. Since the transfer system including the transfer rail 3 and the storage apparatuses 10 is located in an upper region of the semiconductor production line 1 and the substrate processing apparatus 7 is located in a lower region of the semiconductor production line 1, an entire space of the semiconductor production line 1 may be efficiently used.

Figure 4:
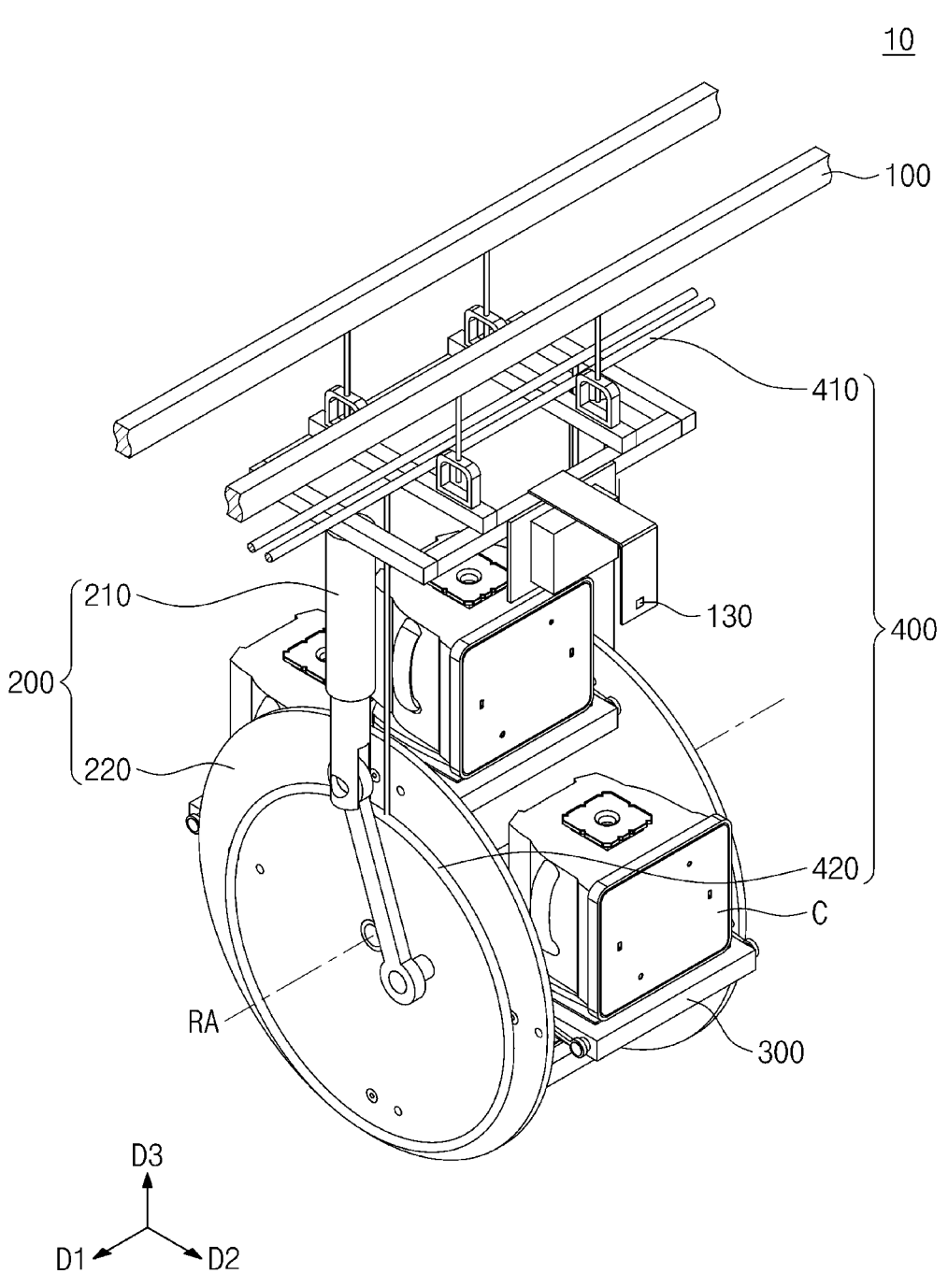
FIG. 4 is a perspective view illustrating a storage apparatus according to some embodiments of the inventive concepts.
Figure 5:
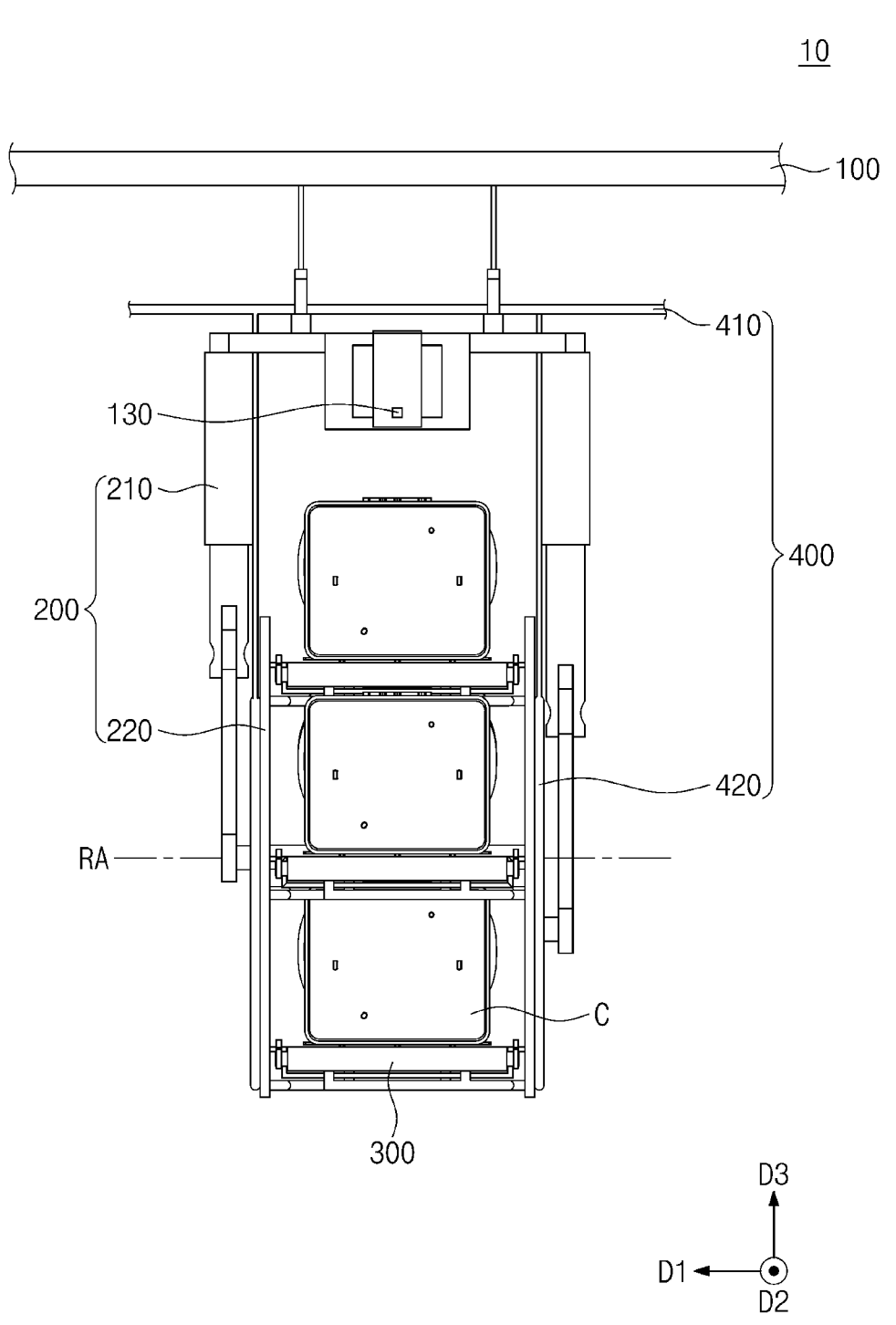
FIG. 5 is a front view illustrating a storage apparatus according to some embodiments of the inventive concepts.
Figure 6:
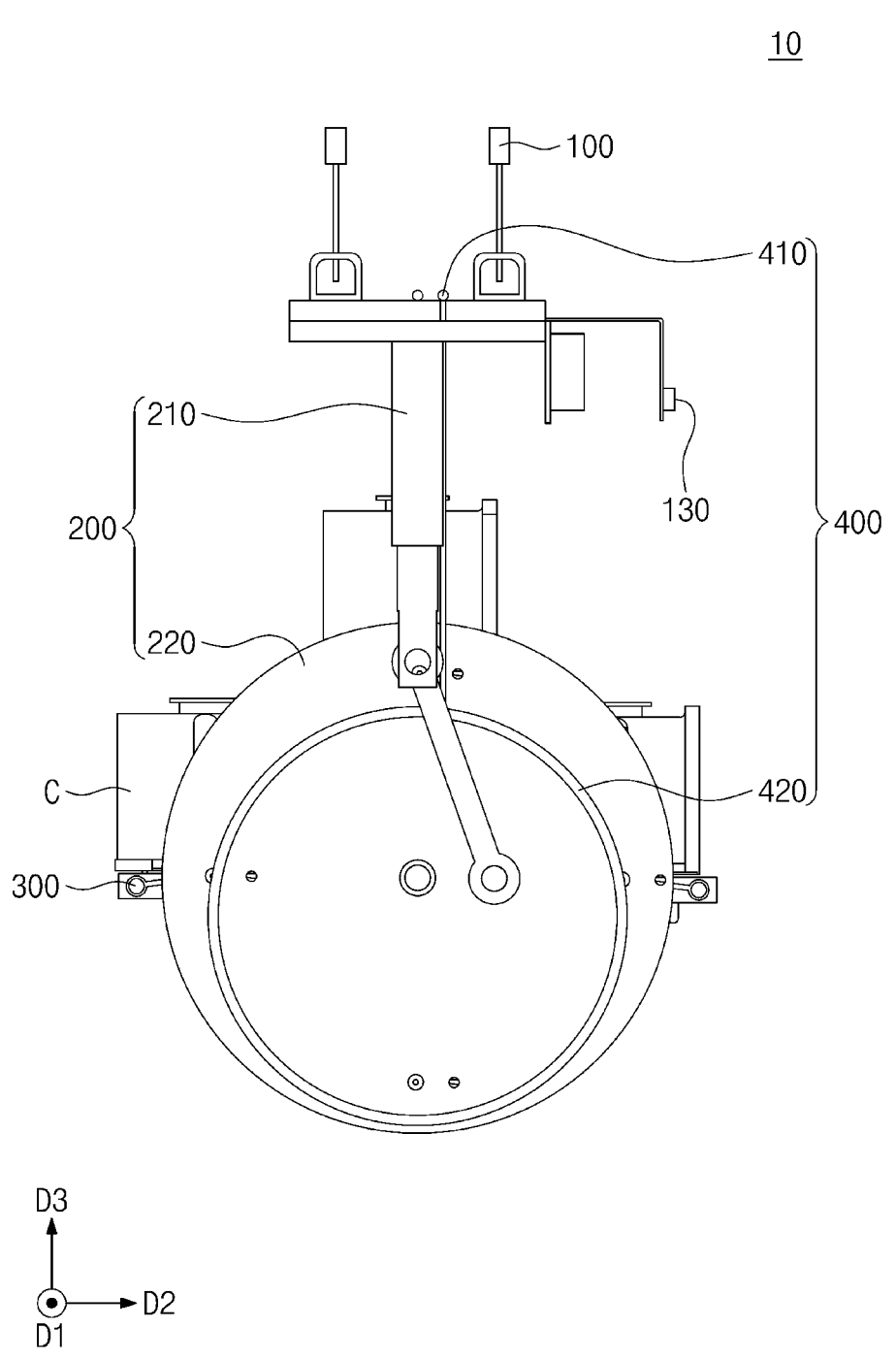
FIG. 6 is a side view illustrating a storage apparatus according to some embodiments of the inventive concepts.

FIG. 4 is a perspective view illustrating a storage apparatus according to some embodiments of the inventive concepts. FIG. 5 is a front view illustrating a storage apparatus according to some embodiments of the inventive concepts. FIG. 6 is a side view illustrating a storage apparatus according to some embodiments of the inventive concepts.

Referring to FIGS. 4 to 6, a storage apparatus 10 of the transfer system may be provided. The storage apparatus 10 may be the storage apparatus described in FIGS. 1 to 3 and may be, more particularly, the motorized storage apparatus. The storage apparatus 10 may include a support part 100, a driving part 200, a plurality of supporting surfaces or "tables" 300, and a gas supply part 400.

The support part 100 may be in contact with the ceiling surface 1a of FIG. 3 and may be fixedly coupled to the ceiling surface 1a. Since the support part 100 is fixed to the ceiling surface 1a, the storage apparatus 10 may be spaced apart from the bottom surface 1b of FIG. 3 in the third direction D3. The support part 100 may be connected to the driving part 200. The support part 100 will be described later in more detail with reference to FIG. 7.

The driving part 200 may include a driving unit 210 and a rotating device such as a rotating plate 220. The driving unit 210 may be connected to the support part 100. The rotating plate 220 may be connected to the driving unit 210. The driving unit 210 may be located between the support part 100 and the rotating plate 220. The driving unit 210 may be configured to rotate the rotating plate 220 about a rotation axis RA parallel to the first direction D1. The rotating plate 220 may be rotatable in a clockwise direction or a counterclockwise direction on a plane defined by the second and third directions D2 and D3. Each of the driving unit 210 and the rotating plate 220 may be provided in plurality, but embodiments of the inventive concepts are not limited thereto. The driving part 200 will be described later in more detail with reference to FIG. 8.

The plurality of tables 300 may be provided on a side surface of the rotating plate 220 and may be spaced apart from each other. Each of the plurality of tables 300 may be coupled to the rotating plate 220. Since the rotating plate 220 is rotated in the clockwise direction or the counter-clockwise direction, the plurality of tables 300 may be moved in the plane defined by second direction D2 and third direction D3. A level, in the third direction D3, of each of the plurality of tables 300 may be changed. In addition, a position, in the second direction D2, of each of the plurality of tables 300 may be changed. Each of the plurality of tables 300 may be parallel to the first and second directions D1 and D2. Even though the plurality of tables 300 is moved by the rotating plate 220, a top surface of each of the plurality of tables 300 may be perpendicular to the third direction D3. Thus, the carrier C may be maintained in a state parallel to a horizontal direction on each of the plurality of tables 300. Since the carrier C is not inclined in a certain direction, it is possible to prevent the plurality of substrates in the carrier C from being broken. The tables 300 need not be planar surfaces as illustrated but could be any suitable holder or support for the carrier C, such as a grating, multiple pins or tabs on which carrier C rests, or other supporting or clamping system that holds carrier C.

Each of the plurality of tables 300 may provide a space capable of receiving the carrier C, and the carrier C may be located in the space. A carrier C may be stored on each of the plurality of tables 300. Thus, a plurality of the carriers C may be stored depending on the number of the plurality of tables 300. The number of the plurality of tables 300 may be four, but embodiments of the inventive concepts are not limited thereto. In certain embodiments, the number of the plurality of tables 300 may be three or may be five or more. The plurality of tables 300 will be described later in more detail with reference to FIGS. 9A and 9B.

The gas supply part 400 may include a main pipe 410 and a branch pipe 420. The main pipe 410 and the branch pipe 420 may be connected to each other. The main pipe 410 may be located on the driving part 200. The main pipe 410 may be connected to a gas supply unit (not shown). The branch pipe 420 may be located on a side surface of the rotating plate 220. The branch pipe 420 may be connected to the plurality of tables 300. A gas generated from the gas supply unit may be supplied to the plurality of tables 300 through the main pipe 410 and the branch pipe 420. Thus, the gas may be supplied into the carriers C on the plurality of tables 300. Contaminant particles in the carrier C may be removed by the gas. As a result, it is possible to prevent failure of the substrate caused by the contaminant particles. For example, the gas may include an inert gas. The inert gas may be nitrogen ($N_2$) and/or argon (Ar). Alternatively, the gas supply part 400 may be omitted. The storage apparatus 10 may not include the gas supply part 400. The gas supply part 400 will be described later in more detail with reference to FIG. 10.

The storage apparatus 10 according to the embodiments of the inventive concepts may store the plurality of carriers C by using the plurality of tables 300. In addition, a position of each of the plurality of tables 300 may be changed by rotating the rotating plate 220. Thus, one of the tables 300 may be located adjacent to the transfer apparatus 5 of FIG. 3. As a result, the carrier C may be transferred from the transfer apparatus 5 to the storage apparatus 10 or from the storage apparatus 10 to the transfer apparatus 5. The storage apparatus 10 of the inventive concepts may store the plurality of carriers C, and the transfer apparatus 5 may load/unload the carrier C into/from the storage apparatus 10.

Figure 7:
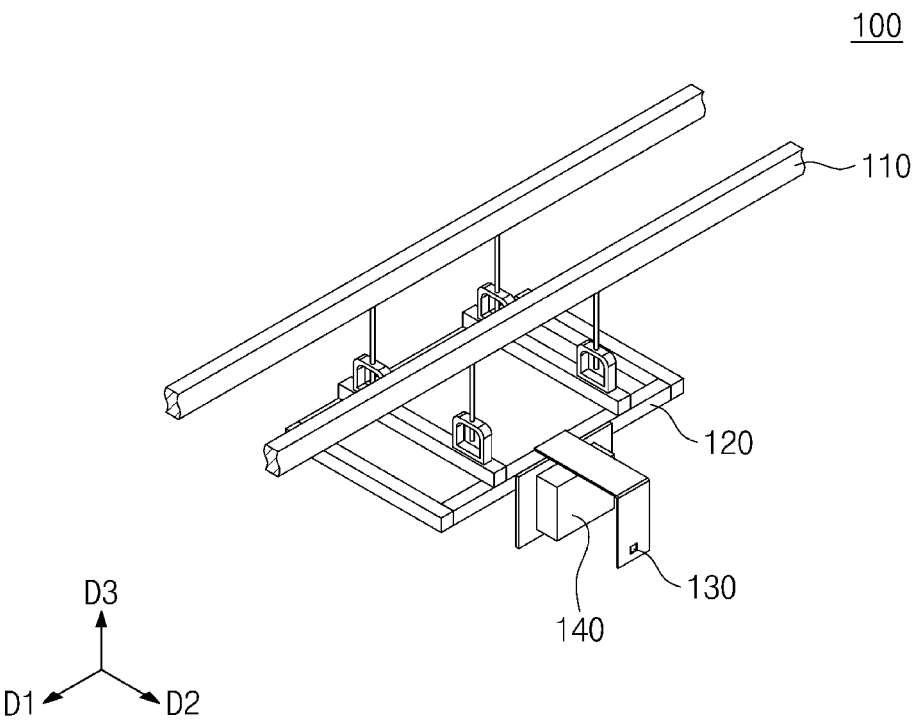
FIG. 7 is a perspective view illustrating a support part of a storage apparatus according to some embodiments of the inventive concepts.

FIG. 7 is a perspective view illustrating a support part of a storage apparatus according to some embodiments of the inventive concepts.

Referring to FIG. 7, the support part 100 may include a support frame 110, a support plate 120, a tag 130, and a controller 140. The support frame 110 may be in direct contact with and fixedly coupled to the ceiling surface 1a of FIG. 3. In the case in which the storage apparatus 10 is provided in plurality, the storage apparatuses 10 may share the support frame 110.

The support plate 120 may be located under the support frame 110. The support plate 120 may be connected and fixed to the support frame 110. The support plate 120 may be connected to the driving part 200 of FIG. 4. The support plate 120 may be located between the driving part 200 and the support frame 110 to connect the driving part 200 to the support frame 110, and thus the driving part 200 may be fixed to the ceiling surface 1a.

The tag 130 may be located on a side surface of the support plate 120, which is adjacent to the transfer rail 3 of FIG. 3. However, embodiments of the inventive concepts are not limited thereto. In certain embodiments, the tag 130 may be directly connected to the support frame 110 or the ceiling surface 1a of FIG. 3. The tag 130 may be used to align the transfer apparatus 5 (see FIG. 3) including a tag sensor 5b with the storage apparatus 10. The tag sensor 5b of the transfer apparatus 5 may be used to recognize the tag 130. The tag sensor 5b recognizing the tag 130 may provide a signal to the transfer apparatus 5 to stop the transfer apparatus 5. Thus, the transfer apparatus 5 may be located exactly in front of the tag 130. As a result, it is possible to prevent the carrier from being out of the storage apparatus 10 or the transfer apparatus 5 when the transfer apparatus 5 loads or unloads the carrier into or from the storage apparatus 10. Since the tag sensor 5b of the transfer apparatus 5 should recognize the tag 130, the transfer apparatus 5 and the tag 130 may be located on the same plane. For example, the tag 130 may be NFC(Near Field Communication), BLE (Bluetooth Low Energy), UWB (Ultra-wideband) RTLS, bar/QR codes, and etc. The tag sensor 5b may be a sensor that detects NFC, BLE, UWB RTLS, bar/QR codes, and etc.

The controller 140 may be connected to the support plate 120. The controller 140 may be located adjacent to the tag 130, but embodiments of the inventive concepts are not limited thereto. In certain embodiments, the controller 140 may be located on a side surface of the support plate 120, which is opposite to the tag 130. The controller 140 may be spaced apart from the support frame 110 and the support plate 120. The controller 140 may exchange electrical signals with the driving part 200 and the plurality of tables 300 of FIG. 4 and the transfer apparatus 5 of FIG. 3. The controller 140 may operate the driving part 200 and the plurality of tables 300 by using the electrical signals. For example, the controller 140 may be constituted by a plurality of PCs.

Figure 8:
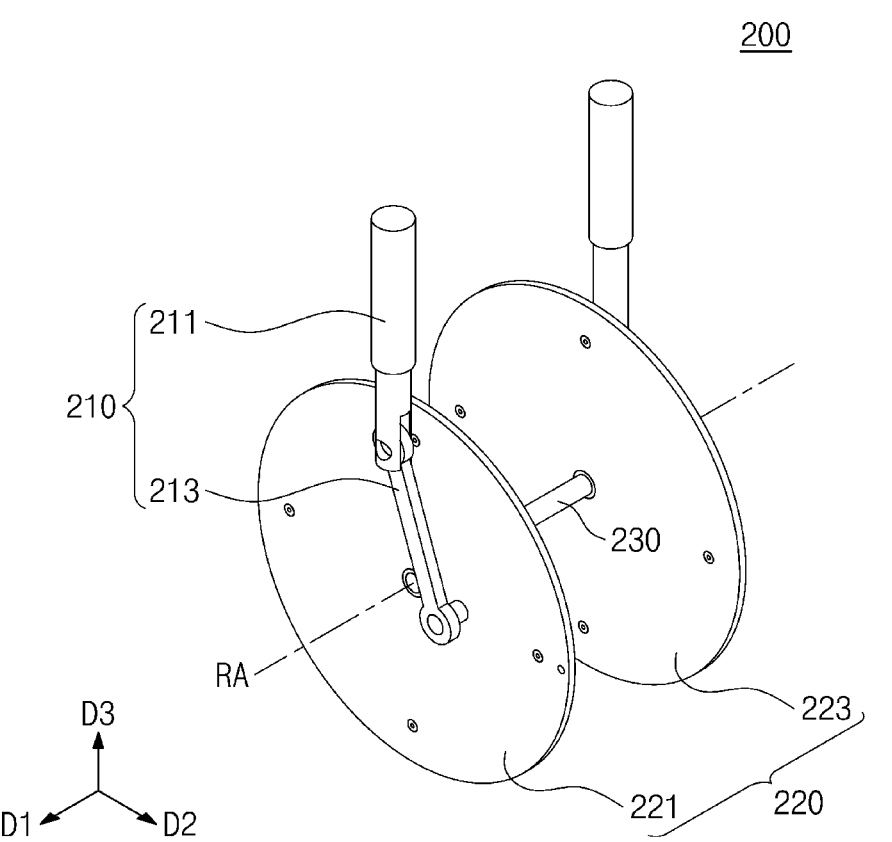
FIG. 8 is a perspective view illustrating a driving part of a storage apparatus according to some embodiments of the inventive concepts.

FIG. 8 is a perspective view illustrating a driving part of a storage apparatus according to some embodiments of the inventive concepts.

Referring to FIG. 8, the driving part 200 may include the driving unit 210, the rotating plate 220, and a connection unit 230. The rotating plate 220 may include a first rotating plate 221 and a second rotating plate 223. The first rotating plate 221 and the second rotating plate 223 may be spaced apart from each other in the first direction D1. The first rotating plate 221 and the second rotating plate 223 may be parallel to the plane defined by the second direction D2 and the third direction D3. Each of the first rotating plate 221 and the second rotating plate 223 may be parallel to the second and third directions D2 and D3 perpendicular to the first direction D1. The first and second rotating plates 221 and 223 may have the same shape. The first and second rotating plates 221 and 223 may have circular shapes, but embodiments of the inventive concepts are not limited thereto.

The connection unit 230 may be located between the first rotating plate 221 and the second rotating plate 223 and may connect the first rotating plate 221 and the second rotating plate 223. The first rotating plate 221 and the second rotating plate 223 may be moved at the same time by the connection unit 230. More particularly, the connection unit 230 may be connected to a center of the first rotating plate 221 and a center of the second rotating plate 223. The rotation axis RA parallel to the first direction D1 may pass through the connection unit 230. Since the first rotating plate 221 and the second rotating plate 223 are spaced apart from each other in the first direction D1, the connection unit 230 may have a shape extending in the first direction D1.

The driving unit 210 may include a slider 211 and a robot arm 213. The slider 211 may be located between the support part 100 of FIG. 4 and the robot arm 213. The slider 211 may be linearly movable. The robot arm 213 may be located between the slider 211 and the rotating plate 220. One end portion of the robot arm 213 may be connected to an end portion of the slider 211. Another end portion of the robot arm 213 may be connected to an off-center portion of the rotating plate 220. A connected portion of the robot arm 213 and the rotating plate 220 may be spaced apart from the rotation axis RA, and thus the robot arm 213 may be two-dimensionally movable by the slider 211 and the rotating plate 220. The driving unit 210 may be provided in plurality. In this case, each of the driving units 210 may be connected to each of the first and second rotating plates 221 and 223. In addition, the robot arms 213 of the driving units 210 may possibly not be parallel to each other. However, embodiments of the inventive concepts are not limited thereto. In certain embodiments, a single driving unit 210 may be connected to one of the first rotating plate 221 and the second rotating plate 223.

In some embodiments, the slider 211 may linearly reciprocate in the third direction D3. The robot arm 213 may reciprocate in the second direction D2 and the third direction D3. Thus, the rotating plate 220 may be rotatable about the rotation axis RA parallel to the first direction D1. The driving part 200 may rotate the rotating plate 220 in the clockwise direction or the counter-clockwise direction by using slider-crank linkage.

Figure 9A:
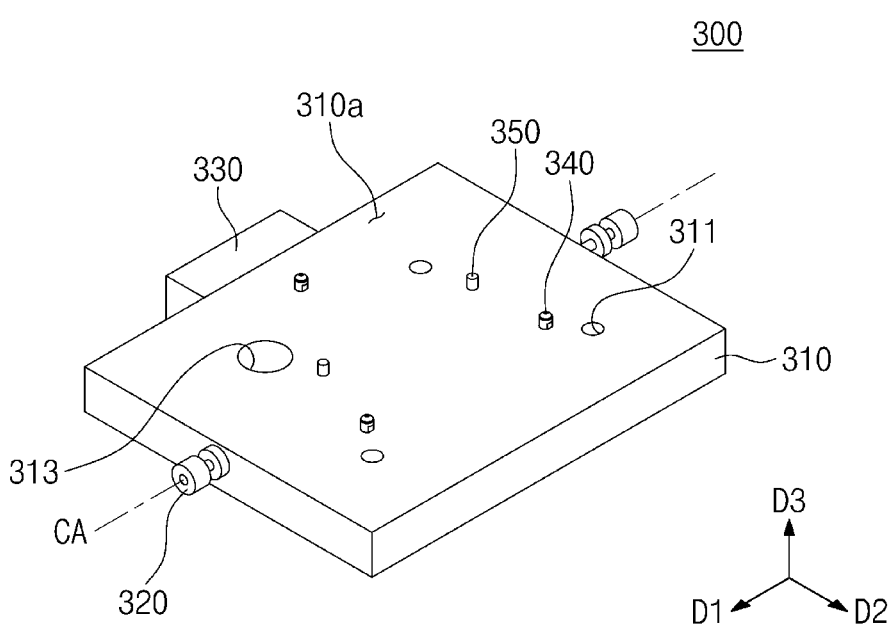
FIG. 9A is a perspective view illustrating a table of a storage apparatus according to some embodiments of the inventive concepts.
Figure 9B:
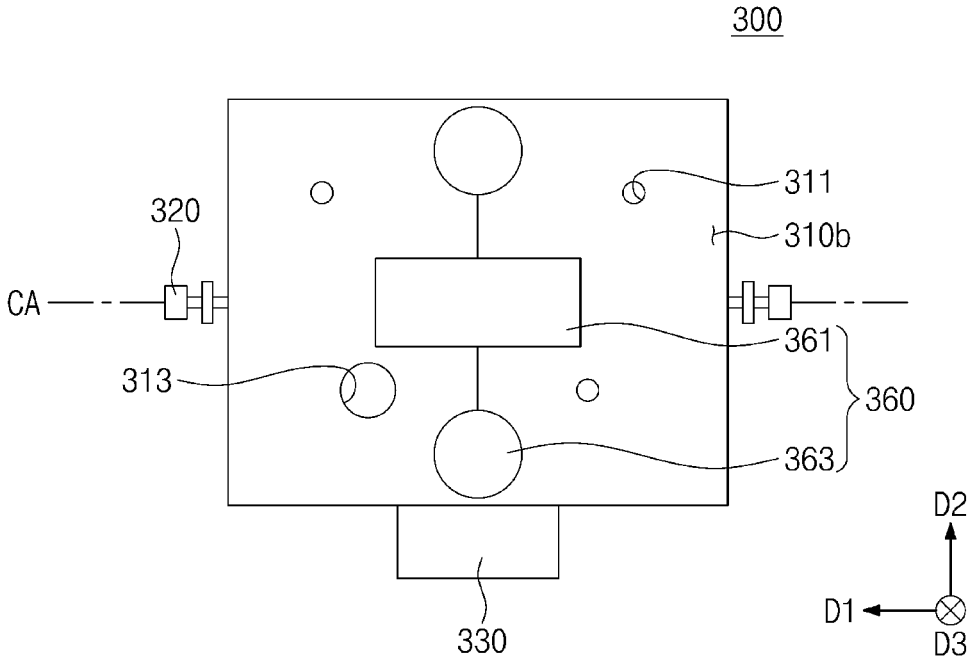
FIG. 9B is a bottom view illustrating a table of a storage apparatus according to some embodiments of the inventive concepts.

FIG. 9A is a perspective view illustrating a table of a storage apparatus according to some embodiments of the inventive concepts. FIG. 9B is a bottom view illustrating a table of a storage apparatus according to some embodiments of the inventive concepts.

Referring to FIGS. 9A and 9B, a table 300 may be one of the tables 300 described with reference to FIGS. 4 to 6. The table 300 may include a support table 310, a coupling member 320, an RFID sensor 330, a guide key 340, a carrier sensor 350, and a horizontal controller 360.

The support table 310 may provide a space capable of receiving a carrier. The carrier may be stored on the support table 310. An area of the support table 310 may be greater than an area of the carrier when viewed in a plan view. The support table 310 may have, but is not limited to, a tetragonal shape (e.g., a square or rectangular shape) when viewed in a plan view.

The support table 310 may provide an injection hole 311 and an exhaust hole 313. The injection hole 311 and the exhaust hole 313 may penetrate the support table 310 in the third direction D3. The injection hole 311 and the exhaust hole 313 may be spaced apart from each other. The injection hole 311 and the exhaust hole 313 may be connected to a bottom surface of the carrier, and the injection hole 311 and the exhaust hole 313 may be connected to the gas supply part 400 to be described later in more detail with reference to FIG. 10. The gas supply part 400 may be connected to the carrier on the support table 310 through the injection hole 311 and the exhaust hole 313. For example, three injection holes 311 and one exhaust hole 313 may be provided and a size of the exhaust hole 313 may be greater than a size of the injection hole 311, but embodiments of the inventive concepts are not limited thereto. For example, a single injection hole and single exhaust hole may be provided, or multiple exhaust holes may be provided in conjunction with a single or multiple injection holes. A grid or array of injection and/or exhaust holes may be provided. Also, the injection and exhaust holes need not be provided in the support table 310 but could be provided to inject or exhaust gas from the top of sides, or to/from other suitable gas connections.

The support table 310 may have a central axis CA passing through a side surface of the support table 310. The central axis CA may be parallel to the first direction D1. The central axis CA may be parallel to the rotation axis RA of FIG. 8. The support table 310 may be located on the side surface of the rotating plate 220 of FIG. 8. More particularly, the support table 310 may be located between the first rotating plate 221 and the second rotating plate 223 of FIG. 8, and the support table 310 may be connected to the first and second rotating plates 221 and 223 along the single central axis CA.

The coupling member 320 may be located on the side surface of the support table 310. More particularly, the coupling member 320 may be located at a center of the side surface of the support table 310, which is adjacent to the rotating plate 220 of FIG. 8. The central axis CA passing through the side surface of the support table 310 may pass through the coupling member 320. The coupling member 320 may be connected to the rotating plate 220. The coupling member 320 may be located between the rotating plate 220 and the support table 310. Since the support table 310 is connected to the rotating plate 220 through the coupling member 320, the support table 310 may be rotatable about the central axis CA. Thus, even though the rotating plate 220 is rotated, the support table 310 may be maintained in parallel to the ceiling surface 1a and/or the bottom surface 1b of FIG. 3. As a result, the carrier may be stably stored on the support table 310. For example, the coupling member 320 may include a bearing.

The RFID sensor 330 may be located on a side surface of the support table 310, through which the central axis CA does not pass. The RFID sensor 330 may provide a signal to the controller 140 of FIG. 7. The RFID sensor 330 may recognize an RFID located on the front of the carrier C. The RFID sensor 330 may recognize the RFID of the carrier and may provide data on the carrier to the controller 140. Thus, a user may confirm or check the data on the carrier located on the support table 310.

The guide key 340 may be located on a top surface 310a of the support table 310 and may be fixedly coupled to the support table 310. The guide key 340 may be provided in plurality, and the plurality of guide keys 340 may be spaced apart from each other. The guide key 340 may be inserted into a recess provided in the bottom surface of the carrier. The guide key 340 may be inserted in the recess of the bottom surface of the carrier to prevent the carrier from moving in a horizontal direction. Thus, the carrier may not move in the first and second directions D1 and D2.

The carrier sensor 350 may be located on the top surface 310*a* of the support table 310. The carrier sensor 350 may check whether an object is located on the support table 310 or not. The carrier sensor 350 may provide a signal to the controller 140 of FIG. 7. For example, when the carrier is located on the support table 310, the carrier sensor 350 may be pressed by the carrier. In this case, the carrier sensor 350 may provide information about the existence of the carrier to the controller 140. On the contrary, when the carrier is removed from the support table 310, the carrier sensor 350 may be restored to its original state. In this case, the carrier sensor 350 may provide information of the removal of the carrier from the support table 310 to the controller 140. The carrier sensor 350 may be provided in plurality and the plurality of carrier sensors 350 may be spaced apart from each other, but embodiments of the inventive concepts are not limited thereto.

The horizontal controller 360 may be located on a bottom surface 310*b* of the support table 310. The horizontal controller 360 may include a horizontal sensor 361 and actuators 363. The horizontal sensor 361 may be located on a central portion of the bottom surface 310*b* of the support table 310. The horizontal sensor 361 may measure an inclined state of the support table 310. For example, the support table 310 may be connected to the rotating plate 220 of FIG. 8 along the central axis CA parallel to the first direction D1 and thus may not be inclined in the first direction D1. The support table 310 may be connected to the rotating plate 220 along the single central axis CA and thus may be inclined in the second direction D2. When the support table 310 is not parallel to the second direction D2, the horizontal sensor 361 may sense it. For example, the horizontal sensor 361 may include a gyro sensor.

The actuators 363 may be located at both sides of the horizontal sensor 361. The actuators 363 may be spaced apart from each other in the second direction D2. The actuators 363 may be connected to the horizontal sensor 361. The horizontal sensor 361 may provide signals to the actuators 363 to operate the actuators 363. The actuators 363 may adjust a level or angle of the support table 310 in such a way that the support table 310 is parallel to the second direction D2. Thus, the support table 310 may be maintained in parallel to a horizontal direction (e.g., the second direction D2) by the horizontal controller 360. Maintaining the support table 310 parallel to a horizontal direction is but one example. It is possible to maintain the support table 310 at a small angle to horizontal, or at larger angles if there are clamps or supports (physical, magnetic etc.) to hold the carrier C in place. It is also possible that the angle, whether horizontal or otherwise, can change, such as depending on the position of the carrier C within the motorized storage apparatus, if the carrier C is being loaded on or unloaded from the motorized storage apparatus, etc.

Figure 10:
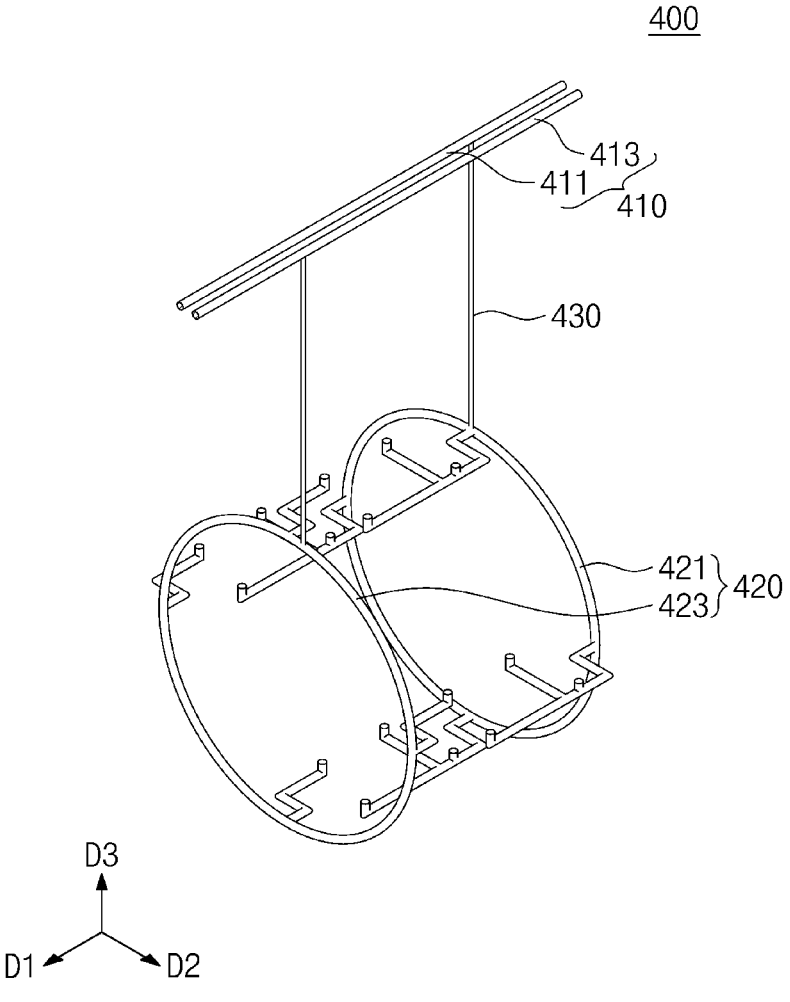
FIG. 10 is a perspective view illustrating a gas supply part of a storage apparatus according to some embodiments of the inventive concepts.

FIG. 10 is a perspective view illustrating a gas supply part of a storage apparatus according to some embodiments of the inventive concepts.

Referring to FIG. 10, the gas supply part 400 may include the main pipe 410, the branch pipe 420, and a connection pipe 430. The main pipe 410, the branch pipe 420 and the connection pipe 430 may provide empty internal spaces, and thus the gas may be movable through the main pipe 410, the branch pipe 420 and the connection pipe 430. The connection pipe 430 may be located between the main pipe 410 and the branch pipe 420. The main pipe 410 and the branch pipe 420 may be connected to each other through the connection pipe 430.

The main pipe 410 may include a supply main pipe 411 and an exhaust main pipe 413. The supply main pipe 411 and the exhaust main pipe 413 may have shapes extending in the first direction D1. The supply main pipe 411 may be connected to the gas supply unit (not shown). In the case in which the storage apparatus 10 is provided in plurality, the gas supply parts 400 of the plurality of storage apparatuses 10 may share a single supply main pipe 411 and a single exhaust main pipe 413.

The branch pipe 420 may include a supply branch pipe 421 and an exhaust branch pipe 423. The supply branch pipe 421 may be connected to the supply main pipe 411 through one of the connection pipes 430. The exhaust branch pipe 423 may be connected to the exhaust main pipe 413 through the other of the connection pipes 430. The branch pipe 420 may be connected to the table 300 of FIG. 9A. More particularly, the supply branch pipe 421 may be connected to the injection hole(s) 311 of the support table 310. The exhaust branch pipe 423 may be connected to the exhaust hole 313 of the support table 310.

The gas generated from the gas supply unit may move into the supply branch pipe 421 through the supply main pipe 411 and the one of the connection pipes 430. Thereafter, the gas may move into the carrier through the injection hole(s) 311 (see FIG. 9A) connected to the supply branch pipe 421. Thus, the gas including contaminant particles existing in the carrier may move into the exhaust branch pipe 423 connected to the exhaust hole 313 of FIG. 9A. After this, the gas may move into the exhaust main pipe 413 through the other of the connection pipes 430 and then may be exhausted to the outside. As a result, the contaminant particles in the carrier may be effectively removed. In addition, the gas supply part 400 may supply the gas to the table 300 of FIG. 9A while the rotating plate 220 of the driving part 200 of FIG. 8 is rotated. The branch pipe 420 may operate simultaneously with the rotating plate 220. Thus, the gas supply part 400 may continuously supply a certain amount of the gas into the carrier. For example, the branch pipe 420 may include a flexible hose and/or a rotary joint.

Figure 11:
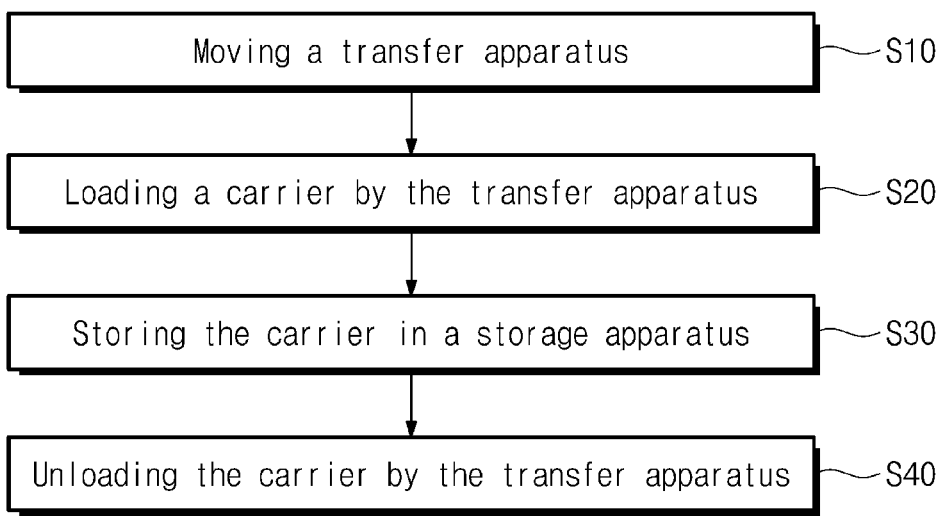
FIG. 11 is a flow chart illustrating a transferring method according to some embodiments of the inventive concepts.

FIG. 11 is a flow chart illustrating a transferring method according to some embodiments of the inventive concepts. FIGS. 12 to 16 are views illustrating a transferring method according to some embodiments of the inventive concepts.

Referring to FIG. 11, a transferring method may be provided. The transferring method may be a method of transferring the carrier C using the transfer system including the storage apparatus 10 described with reference to FIGS. 4 to 10. The transferring method may include moving a transfer apparatus (S10), loading a carrier by the transfer apparatus (S20), storing the carrier in a storage apparatus (S30), and unloading the carrier by the transfer apparatus (S40).

Figure 12:
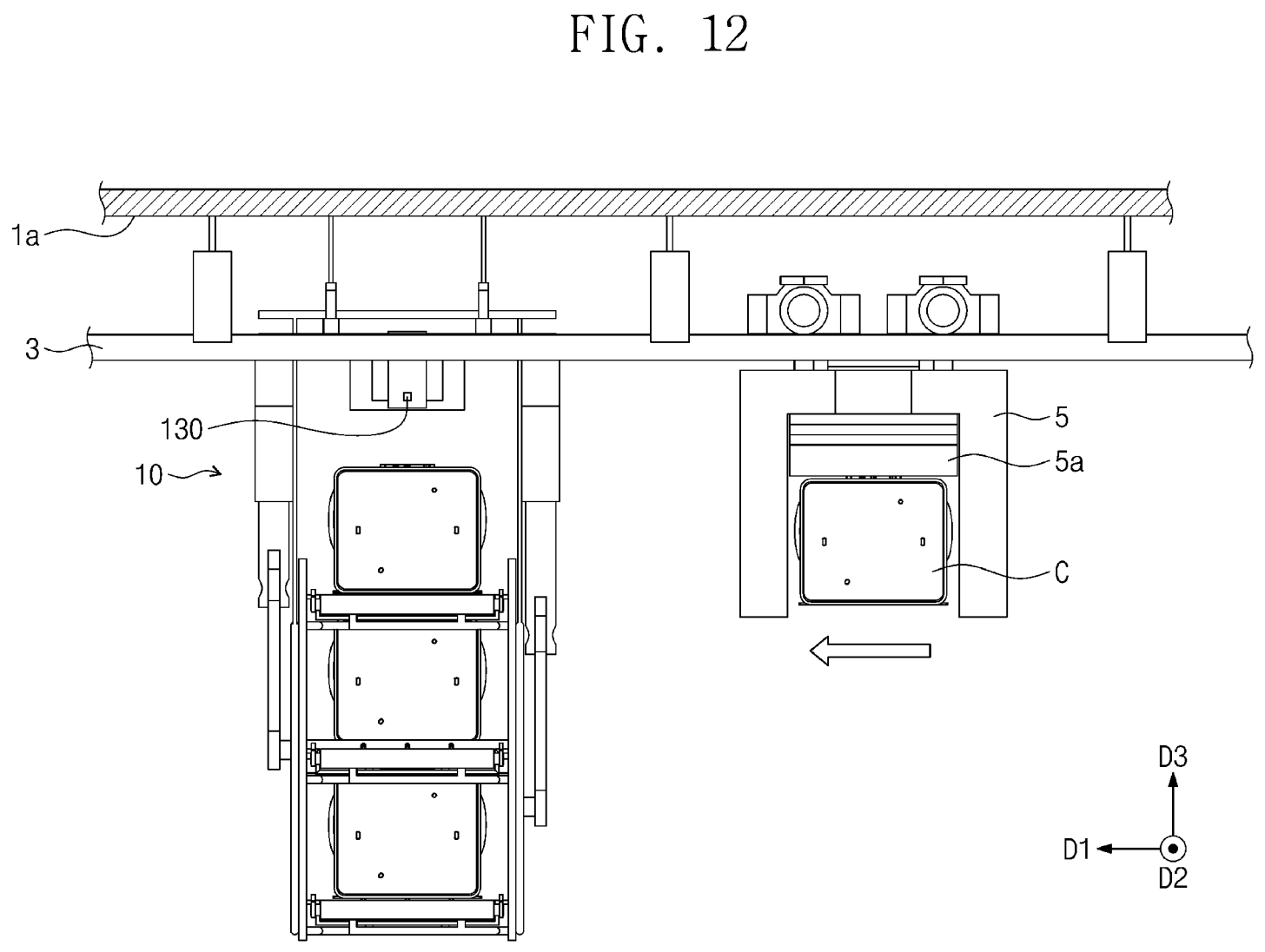

Referring to FIGS. 11 and 12, the moving of the transfer apparatus (S10) may include moving the transfer apparatus 5 to the storage apparatus 10 and recognizing the tag 130 of the storage apparatus 10 by the tag sensor 5*b* of the transfer apparatus 5. The transfer apparatus 5 may receive a signal from a control system for managing the semiconductor production line. The transfer apparatus 5 receiving the signal from the control system may be moved to the storage apparatus 10 along the transfer rail 3. The transfer apparatus 5 may include a driving member 5*a*, and the driving member 5a may fix the carrier C. The carrier C may be transferred while being fixed to the transfer apparatus 5 by the driving member 5a.

The transfer apparatus 5 may be moved along the transfer rail 3 and then may be stopped in front of the storage apparatus 10. Thereafter, the tag sensor 5b of the transfer apparatus 5 may recognize or sense the tag 130 of the storage apparatus 10. The transfer apparatus 5 may be stopped at an exact position due to the tag 130. Thus, the transfer apparatus 5 may be aligned with the storage apparatus 10 in the second direction D2.

Figure 13:
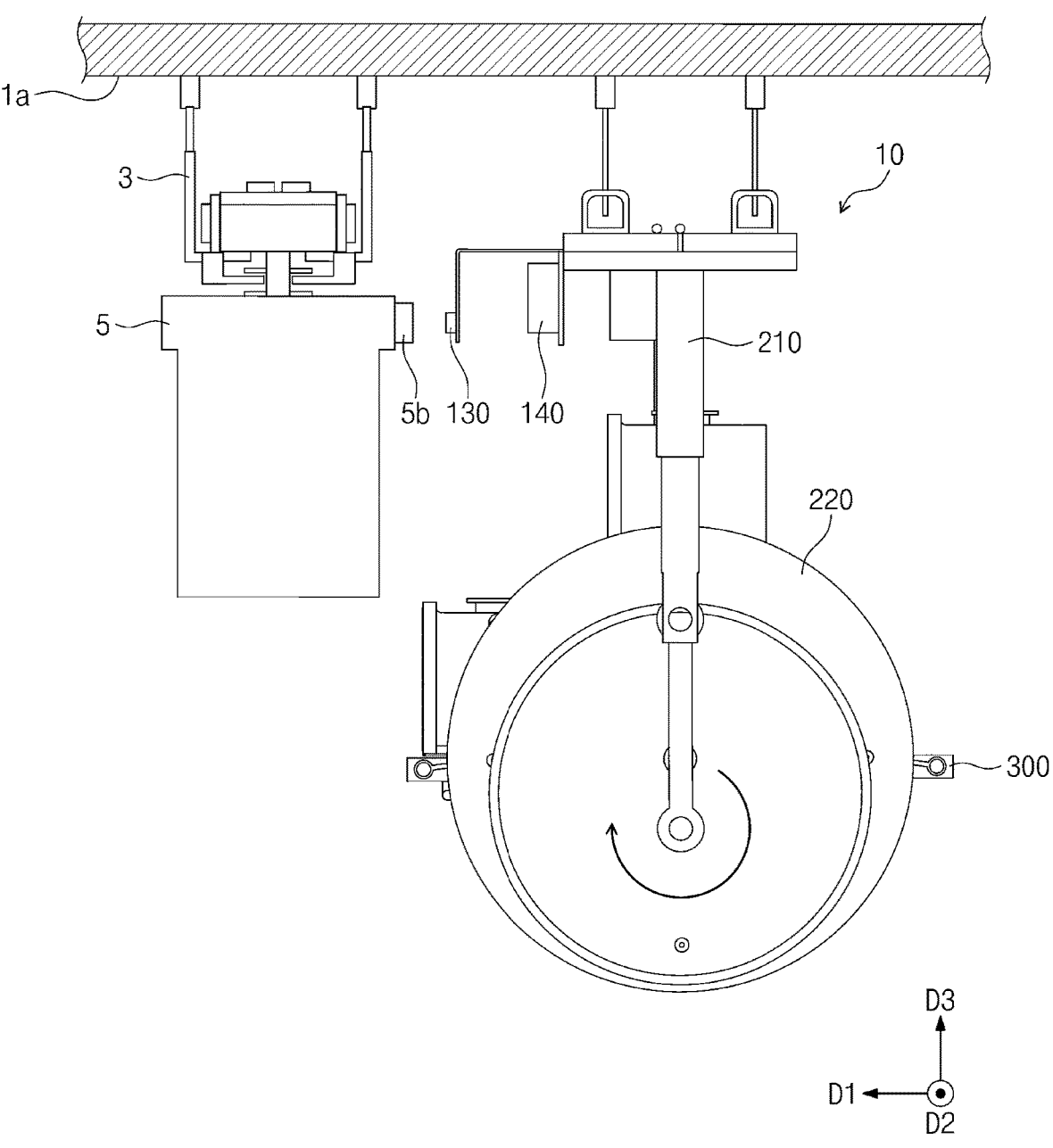
Figure 14:
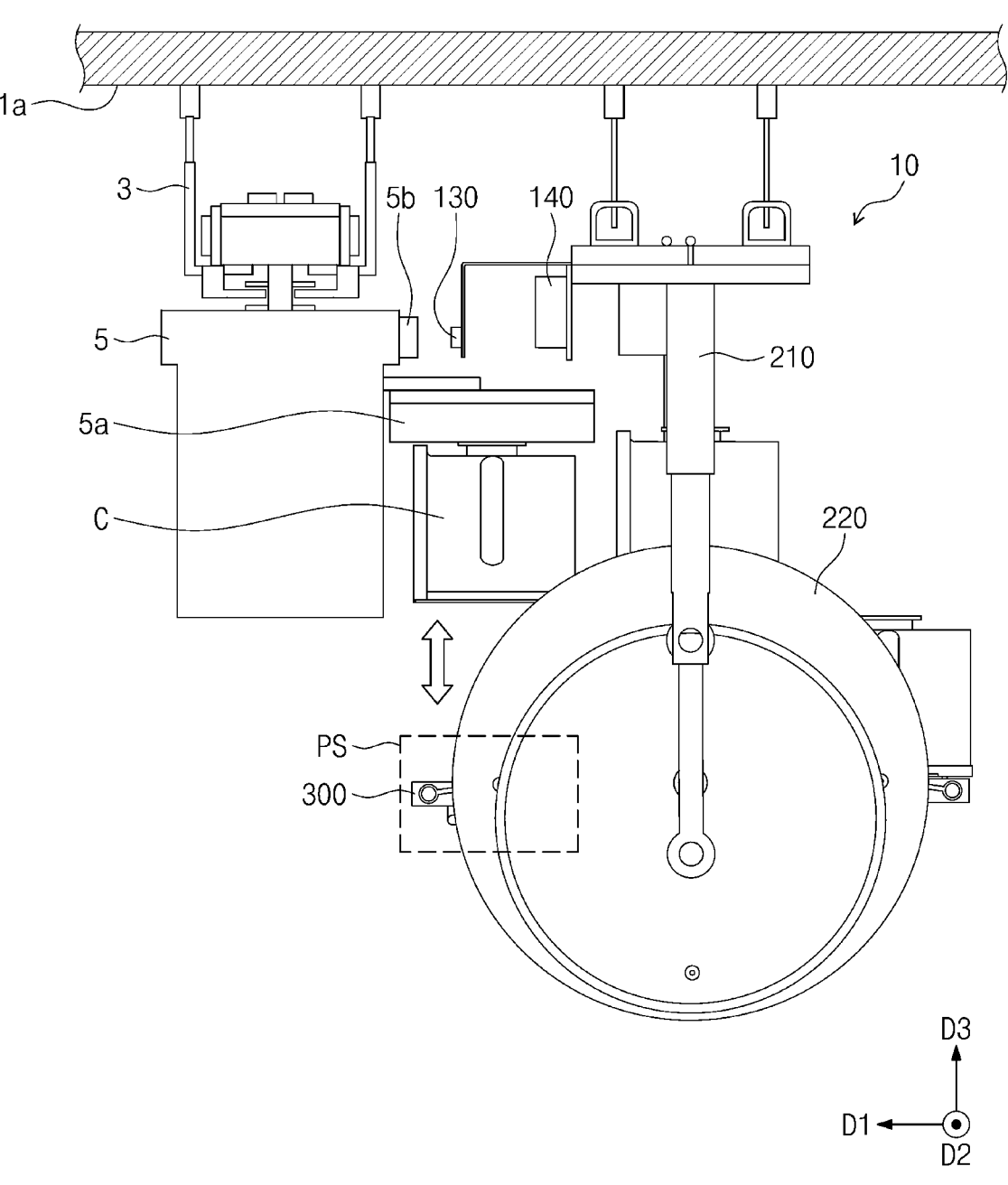

Referring to FIGS. 11, 13 and 14, the loading of the carrier by the transfer apparatus (S20) may include rotating the rotating plate 220, locating an empty table 300 in a pick-up space PS, locating the carrier C on the empty table 300, and maintaining the plurality of tables 300 in parallel to a horizontal direction.

The rotating of the rotating plate 220 may be performed by the driving unit 210. The driving unit 210 may be operated in response to a signal received from the controller 140. The rotating plate 220 may be rotated about the rotation axis parallel to the first direction D1 in the clockwise direction or the counter-clockwise direction. Thus, positions of the plurality of tables 300 may be changed. Each of the plurality of tables 300 may be moved in the second direction D2 and/or the third direction D3.

Since the rotating plate 220 is rotated, the empty table 300 (e.g., the table on which the carrier C is not located) may be located in the pick-up space PS. The pick-up space PS may be defined as a region in which the transfer apparatus 5 and the table 300 are closest to each other in the second direction D2. The pick-up space PS may be a region in which the transfer apparatus 5 and the table 300 are closest to each other in a horizontal direction. Thus, the driving member 5a of the transfer apparatus 5 may move the least in the second direction D2 and thus may descend in the third direction D3 in a state in which the carrier C is adjacent to the transfer apparatus 5. As a result, a change in center of gravity between the transfer apparatus 5 and the carrier C may be small, and thus the carrier C may stably descend.

The carrier C may descend in the third direction D3 so as to be located on the empty table 300. At this time, the guide key 340 of FIG. 9A may be inserted into the recess of the bottom surface of the carrier C, and the carrier sensor 350 may be pressed by the carrier C. In addition, the RFID sensor 330 may recognize or sense the RFID located on the front of the carrier C and may provide information on the carrier C to the controller 140.

The maintaining of the plurality of tables 300 in parallel to the horizontal direction may be performed by the horizontal controller 360 of FIG. 9B. Each of the plurality of tables 300 may be connected to the rotating plate 220 along the single central axis CA parallel to the first direction D1, and thus the plurality of tables 300 may be inclined in the horizontal direction (e.g., the second direction D2). The actuators 363 of the horizontal controller 360 may adjust a level of the table 300 in such a way that each of the plurality of tables 300 is parallel to the horizontal direction. As a result, each of the plurality of tables 300 may be parallel to the horizontal direction, and thus the carriers C on the plurality of tables 300 may be stably located.

Figure 15:
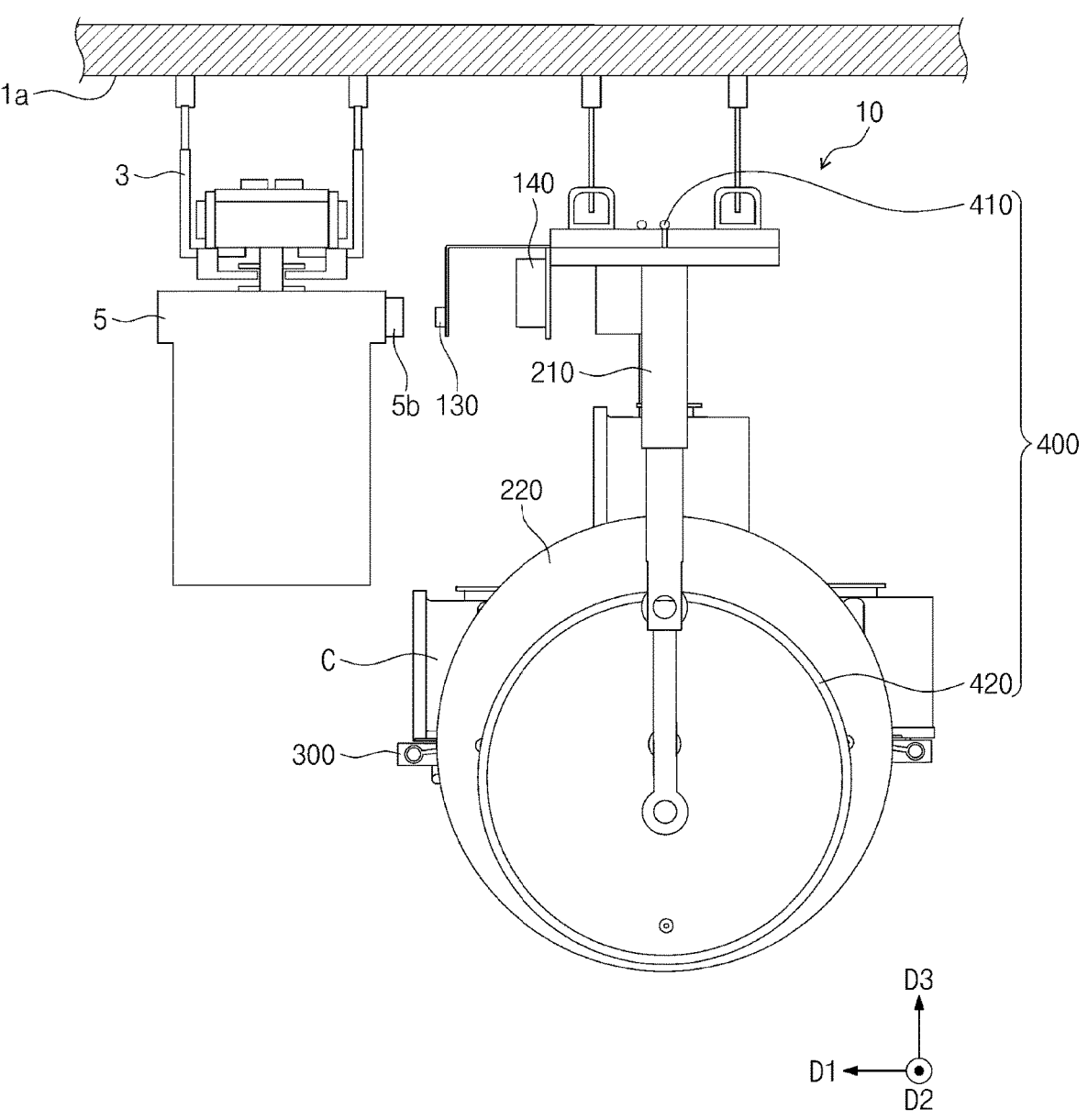

Referring to FIGS. 10, 11 and 15, the storing of the carrier in the storage apparatus (S30) may include supplying a gas into the carrier C, and exhausting the gas from the inside of the carrier C. The supplying/exhausting of the gas into/from the carrier C may be performed by the gas supply part 400. More particularly, the supplying of the gas into the carrier C may be performed by the supply main pipe 411, the one of the connection pipes 430 and the supply branch pipe 421. The exhausting of the gas from the carrier C may be performed by the exhaust main pipe 413, the other of the connection pipes 430 and the exhaust branch pipe 423. The supplying/exhausting of the gas into/from the carrier C may be continuously performed while the rotating plate 220 is rotated. Thus, the carriers C on the plurality of tables 300 may be free of contaminant. For example, the gas may include an inert gas.

Referring to FIGS. 11 and 14 to 16, the unloading of the carrier by the transfer apparatus (S40) may include moving the transfer apparatus 5 to the storage apparatus 10, rotating the rotating plate 220, locating the table 300 in the pick-up space PS, removing the carrier C from the table 300, and maintaining the plurality of tables 300 in parallel to the horizontal direction. The unloading of the carrier by the transfer apparatus (S40) may be substantially similar to the loading of the carrier by the transfer apparatus (S20).

More particularly, the transfer apparatus 5 may be moved to the storage apparatus 10. The transfer apparatus 5 may not have the carrier C. The transfer apparatus 5 in which the carrier C does not exist may be moved to the storage apparatus 10. The rotating plate 220 may be rotated to locate the table 300, on which the carrier C to be transferred is located, in the pick-up space PS. Thereafter, the transfer apparatus 5 may remove the carrier C from the table 300 by using the driving member 5a. Like the loading of the carrier by the transfer apparatus (S20), the plurality of tables 300 may be maintained in parallel to the horizontal direction.

The transferring method according to the inventive concepts may be performed using the storage apparatus 10 including the plurality of tables 300, and thus a plurality of the carriers C may be stored in the storage apparatus 10 in a transferring process. As a result, the transferring of the carrier C may be efficiently performed. In addition, the storage apparatus 10 may be fixedly coupled to the ceiling surface 1a, and thus the entire space of the semiconductor production line may be efficiently used.

The storage apparatus according to the embodiments of the inventive concepts may include the plurality of tables capable of receiving the carriers. Each of the plurality of tables may be rotated by the rotating plate while being maintained in parallel to the horizontal direction. Thus, the storage apparatus may stably store a plurality of the carriers. As a result, the transferring of the carrier may be efficiently performed. In addition, the storage apparatus may be fixedly coupled to the ceiling surface, and thus the space of the semiconductor production line may be efficiently used.

While the embodiments of the inventive concepts have been particularly shown and described, it will be understood by one of ordinary skill in the art that variations in form and detail may be made therein without departing from the spirit and scope of the attached claims.

What is claimed is:
1. A storage apparatus comprising:
a support part fixedly coupled to a ceiling surface;
a rotating plate under the support part,
a driving unit connecting the support part and the rotating plate; and
a plurality of tables spaced apart from each other,
wherein each of the plurality of tables has an axis,
wherein each of the plurality of tables is connected to the rotating plate, and
wherein the rotating plate is rotatable about a rotation axis parallel to the axis.

2. The storage apparatus of claim 1, wherein the rotating plate includes a first rotating plate and a second rotating plate, and wherein the plurality of tables is located between the first and second rotating plates.

3. The storage apparatus of claim 1, wherein each of the plurality of tables is parallel to a horizontal direction perpendicular to the axis.

4. The storage apparatus of claim 1, further comprising:

a gas supply part connected to each of the plurality of tables.

5. The storage apparatus of claim 1, wherein each of the plurality of tables comprises a horizontal controller, and wherein the horizontal controller comprises a horizontal sensor and an actuator.

6. The storage apparatus of claim 1, wherein each of the plurality of tables comprises a guide key, an RFID sensor, and a carrier sensor.

7. The storage apparatus of claim 1, wherein the support part comprises a controller and a tag.

8. The storage apparatus of claim 1, wherein the driving unit comprises a slider and a robot arm, wherein the slider is connected to the support part, and wherein the robot arm is connected to the rotating plate.

9. The storage apparatus of claim 1, wherein the plurality of tables and the rotating plate are spaced apart from a bottom surface opposite to the ceiling surface in a vertical direction.

10. A transfer system comprising:

a transfer rail fixedly coupled to a ceiling surface, a transfer apparatus which is movable along the transfer rail and comprises a tag sensor; and a storage apparatus spaced apart from the transfer rail in a horizontal direction, wherein the storage apparatus comprises:

a support part comprising a tag;

a driving unit connected to the support part;

a rotating plate connected to the driving unit; and a plurality of tables coupled to the rotating plate, wherein each of the plurality of tables is parallel to the horizontal direction.

11. The transfer system of claim 10, wherein the storage apparatus further comprises: a gas supply part, and wherein the gas supply part is connected to each of the plurality of tables.

12. The transfer system of claim 10, wherein the tag sensor of the transfer apparatus and the tag of the support part are located on the same plane.

13. The transfer system of claim 10, wherein each of the plurality of tables comprises a horizontal controller.

14. The transfer system of claim 10, wherein each of the plurality of tables comprises a coupling member, and wherein the coupling member is located on a side surface of each of the plurality of tables and is connected to the rotating plate.

15. The transfer system of claim 10, wherein the storage apparatus is provided in plurality, and wherein the storage apparatuses are disposed at both sides of the transfer rail.

16. The transfer system of claim 10, wherein the transfer rail, the transfer apparatus and the storage apparatus are spaced apart from a bottom surface opposite to the ceiling surface in a vertical direction and are closer to the ceiling surface than to the bottom surface.

17. A transferring method comprising:

moving a transfer apparatus to a storage apparatus including a plurality of tables;

loading a carrier by the transfer apparatus;

storing the carrier in the storage apparatus; and unloading the carrier by the transfer apparatus, wherein loading and unloading the carrier comprises:

rotating a rotating plate coupled to the plurality of tables;

maintaining the plurality of tables in parallel to a horizontal direction; and locating one of the plurality of tables in a pick-up space.

18. The transferring method of claim 17, wherein the storing of the carrier in the storage apparatus comprises: supplying and exhausting a gas into and from the carrier.

19. The transferring method of claim 17, wherein each of the plurality of tables comprises a horizontal controller, and wherein the maintaining of the plurality of tables in parallel to the horizontal direction is performed by the horizontal controllers.

20. The transferring method of claim 17, wherein the pick-up space is a region closest to the transfer apparatus in the horizontal direction.

* * * * *